(12) United States Patent
Kondo et al.

(10) Patent No.: US 8,888,324 B2
(45) Date of Patent: Nov. 18, 2014

(54) LIGHT-EMITTING DEVICE, METHOD FOR ASSEMBLING SAME AND LUMINAIRE

(71) Applicant: Toshiba Lighting & Technology Corporation, Kanagawa (JP)

(72) Inventors: Kazuya Kondo, Kanagawa (JP); Yuichiro Takahara, Kanagawa (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 47 days.

(21) Appl. No.: 13/720,684

(22) Filed: Dec. 19, 2012

(65) Prior Publication Data

US 2014/0085890 A1    Mar. 27, 2014

(30) Foreign Application Priority Data

Sep. 24, 2012 (JP) ................................. 2012-209847

(51) Int. Cl.
| | | |
|---|---|---|
| F21S 4/00 | (2006.01) | |
| H01L 25/075 | (2006.01) | |
| F21K 99/00 | (2010.01) | |
| F21V 21/00 | (2006.01) | |
| F21S 8/02 | (2006.01) | |
| F21V 23/06 | (2006.01) | |
| F21Y 101/02 | (2006.01) | |
| F21V 15/01 | (2006.01) | |

(52) U.S. Cl.
CPC ............ *F21V 21/00* (2013.01); *H01L 25/0753* (2013.01); *F21S 8/026* (2013.01); *F21V 23/06* (2013.01); *F21Y 2101/02* (2013.01); *F21K 9/30* (2013.01); *F21V 15/011* (2013.01)
USPC .................................. 362/249.01; 362/249.02

(58) Field of Classification Search
USPC ....................................................... 362/249.01
See application file for complete search history.

(56) References Cited

U.S. PATENT DOCUMENTS

| | | | |
|---|---|---|---|
| 8,162,508 B2 * | 4/2012 | Murakoshi et al. ....... | 362/249.02 |
| 8,272,757 B1 * | 9/2012 | Fan et al. ...................... | 362/231 |
| 2009/0207125 A1 * | 8/2009 | Park et al. ...................... | 345/102 |
| 2011/0050111 A1 * | 3/2011 | Tanaka et al. .............. | 315/185 R |
| 2012/0044669 A1 * | 2/2012 | Ogata et al. .................. | 362/97.3 |

FOREIGN PATENT DOCUMENTS

JP    2011-060961    3/2011

* cited by examiner

*Primary Examiner* — Evan Dzierzynski
(74) *Attorney, Agent, or Firm* — Patterson & Sheridan LLP (57) ABSTRACT

According to one embodiment, a light-emitting device includes a substrate, a first light-emitting element group, a second light-emitting element group, and a terminal group. The first light-emitting element group includes plural first light-emitting elements mounted on the substrate. The second light-emitting element group is mounted on the substrate alongside the first light-emitting element group and includes plural second light-emitting elements. The terminal group includes plural terminals electrically connected to the first light-emitting element group and the second light-emitting element group, and is arranged on a side of the first light-emitting element group opposite to a side thereof facing the second light-emitting element group in a first direction in which the first light-emitting element group and the second light-emitting element group on the substrate are arranged side by side.

18 Claims, 5 Drawing Sheets

LIGHT-EMITTING DEVICE, METHOD FOR ASSEMBLING SAME AND LUMINAIRE

CROSS-REFERENCE TO RELATED APPLICATIONS

This application is based upon and claims the benefit of priority from Japanese Patent Application No. 2012-209847, filed on Sep. 24, 2012; the entire contents of which are incorporated herein by reference.

FIELD

Embodiments described herein relate generally to a light-emitting device, a method for assembling the same and a luminaire.

BACKGROUND

As a light-emitting module (light-emitting device) used for a light-emitting unit of a luminaire, for example, there is one in which plural LEDs (Light Emitting Diodes) are mounted on a substrate as abase and are sealed with resin. A luminaire with a large light quantity includes plural light-emitting modules and different lighting circuits independently supply electric power. Thus, the power load of each of the lighting circuits is reduced, and an inexpensive and highly reliable electronic component can be used. However, luminous intensity distribution control of a luminaire is easier in a luminaire including one light-emitting module than in a luminaire including plural light-emitting modules.

DETAILED DESCRIPTION

In general, according to one embodiment, a light-emitting device includes a substrate, a first light-emitting element group, a second light-emitting element group, and a terminal group. The first light-emitting element group includes plural first light-emitting elements mounted on the substrate. The second light-emitting element group is mounted on the substrate alongside the first light-emitting element group and includes plural second light-emitting elements. The terminal group includes plural terminals electrically connected to the first light-emitting element group and the second light-emitting element group, and is arranged on a side of the first light-emitting element group opposite to a side thereof facing the second light-emitting element group in a first direction in which the first light-emitting element group and the second light-emitting element group on the substrate are arranged side by side.

Further, according to another embodiment, a luminaire includes a light-emitting unit including the light-emitting device, and a lighting unit including a first lighting circuit and a second lighting circuit. The first lighting circuit supplies power to the first light-emitting element group through a first terminal electrically connected to an anode of the first light-emitting element and a second terminal electrically connected to a cathode of the first light-emitting element among the plural terminals. The second lighting circuit supplies power to the second light-emitting element group through a third terminal electrically connected to an anode of the second light-emitting element and a fourth terminal electrically connected to a cathode of the second light-emitting element among the plural terminals.

Hereinafter, embodiments of the invention will be described with reference to the drawings. Incidentally, same portions in the drawings are denoted by the same reference numeral and the detailed description thereof will be suitably omitted and different portions will be described. Besides, respective portions are described using XYZ rectangular coordinates shown in the drawings in some cases.

First Embodiment

Figure 1A:
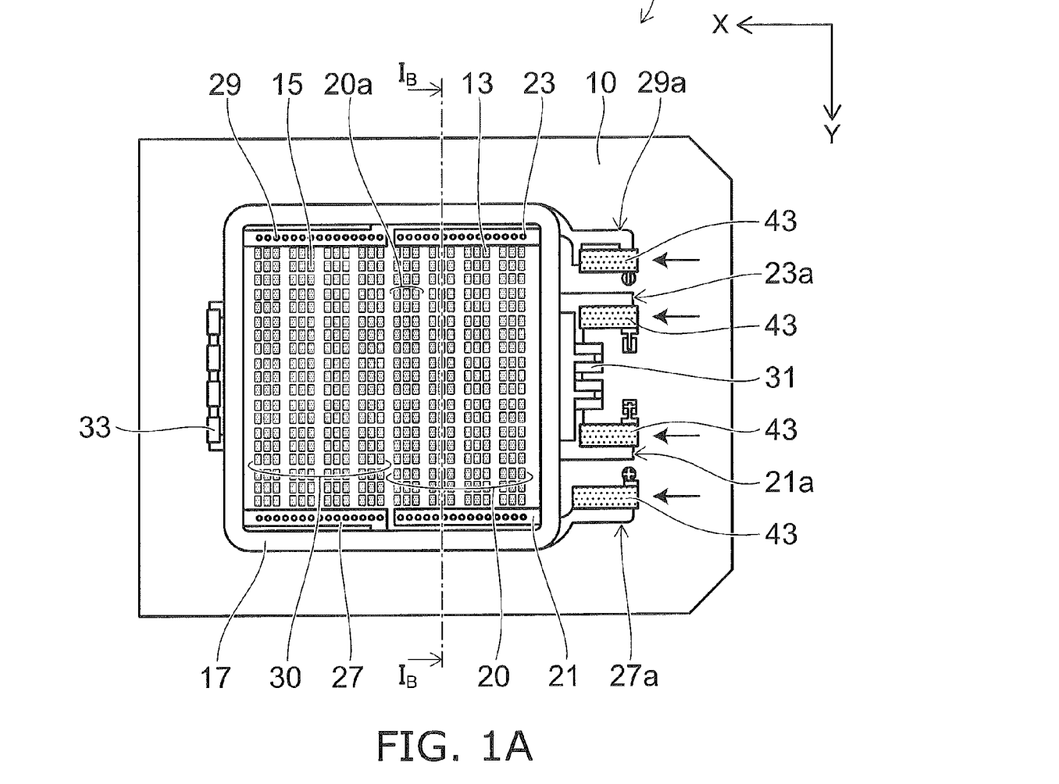
FIGS. 1A and 1B are schematic views showing a light-emitting device of a first embodiment.
Figure 1B:
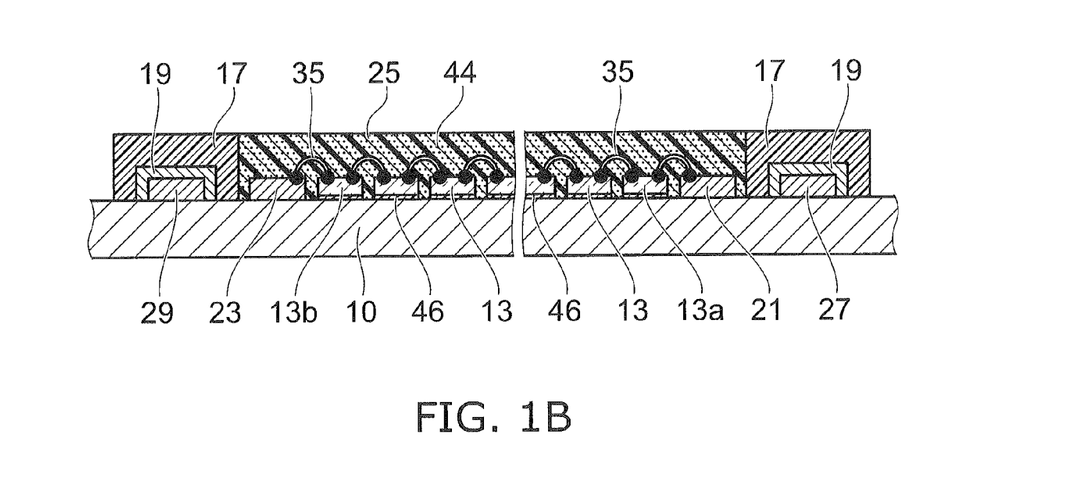

FIGS. 1A and 1B are schematic views showing a light-emitting device 1 of a first embodiment. FIG. 1A is a plan view showing a light-emitting surface 10a of the light-emitting device 1. FIG. 1B is a sectional view taken along line $I_B$-$I_B$ indicated in FIG. 1A.

The light-emitting device 1 is a light-emitting module in which plural light-emitting elements, for example light-emitting diodes (LEDs) are mounted on a substrate 10. The substrate 10 is, for example, a ceramic substrate made of aluminum oxide, and may include a metal layer on at least one of a front surface and a back surface. Besides, the substrate may be an aluminum substrate coated with an insulating layer.

As shown in FIG. 1A, the light-emitting device 1 includes a first light-emitting element group (hereinafter referred to as an LED group 20) including plural first light-emitting elements (hereinafter referred to as LEDs 13) mounted on the substrate 10 and a second light-emitting element group (LED group 30) including plural second light-emitting elements (hereinafter referred to as LEDs 15) mounted on the substrate 10. The LED group 20 and the LED group 30 are mounted side by side on the substrate 10 in an X direction as a first direction.

The LED group 20 is mounted between a first wiring (hereinafter called a wiring 21) and a second wiring (hereinafter called a wiring 23), and is electrically connected to the respective wirings. The LED group 30 is mounted between a third wiring (hereinafter called a wiring 27) and a fourth wiring (hereinafter called a wiring 29), and is electrically connected to the respective wirings.

The light-emitting device 1 includes plural terminals 21a, 23a, 27a and 29a electrically connected to the LED group 20 and the LED group 30. Each of the plural terminals includes a receptacle 43 of a single pole connector 40 mounted on an end part thereof. Incidentally, the terminal in this specification may include an end part itself of each wiring or may include the receptacle 43 mounted on the end part.

A terminal group including the terminals 21a, 23a, 27a and 29a is provided on a side of the LED group 20 opposite to a side thereof facing the LED group 30 in the X direction. That is, the LED group 20 is mounted between the LED group 30 and the terminal group.

Further, the light-emitting device 1 includes an outer peripheral frame 17 provided on the substrate 10 and surrounding the LED group 20 and the LED group 30. A resin layer 25 covering the LED group 20 and the LED group 30 is provided inside the outer peripheral frame 17.

As shown in FIG. 1B, the resin layer 25 is the resin to seal the LED group 20 and the LED group 30, and includes, for example, a phosphor 44. The phosphor 44 is excited by emitted light of the LED groups 20 and 30 and emits light with a wavelength different from the exciting light.

For example, silicone resin can be used for the resin layer 25. The outer peripheral frame 17 also includes resin, for example, silicone. The LEDs 13 included in the LED group 20 and the LEDs 15 included in the LED group 30 are, for example, blue LEDs, and the phosphor 44 is, for example, YAG phosphor. The light-emitting device 1 emits white light in which blue light emitted from the LEDs 13 and 15 is mixed with yellow light emitted from the phosphor 44.

As described later, the outer peripheral frame 17 covers a part of each of the wiring 21, the wiring 23, the wiring 27 and the wiring 29. As shown in FIG. 1B, a glass coat 19 is applied to the portion of each of the wirings covered with the outer peripheral frame. By this, adhesion force between each of the wirings and the outer peripheral frame 17 can be raised.

Besides, as shown in FIG. 1B, the plural LEDs 13 mounted between the wiring 21 and the wiring 23 are connected in series to each other through metal wires 35. An anode of an LED 13a positioned at one end of the series connection is electrically connected to the wiring 21 through a metal wire 35. A cathode of an LED 13b positioned at the other end of the series connection is electrically connected to the wiring 23 through a metal wire 35. The plural LEDs 15 mounted between the wiring 27 and the wiring 29 are also connected in series to each other through metal wires 35. An anode of an LED 15 positioned at one end of the series connection is connected to the wiring 27 through a metal wire 35, and a cathode of an LED 15 positioned at the other end is connected to the wiring 29 through a metal wire 35.

In this embodiment, the LED group 20 mounted between the wiring 21 and the wiring 23 includes four series-connected LED groups 20a, and each of the LED groups 20a includes 57 LEDs 13. A voltage of, for example, 160V is applied between the wiring 21 and the wiring 23 and the LED group 20 can be made to emit light. The same applies to the LED group 30 mounted between the wiring 27 and the wiring 29.

The LEDs 13 and the LEDs 15 are mounted on the substrate 10 through, for example, an adhesive 46, and the respective LEDs are connected through the metal wires. Thus, a land pattern for chip mount and a bonding pad for wire bonding are not required to be formed in an area where the LED group 20 is mounted and an area where the LED group 30 is mounted. Accordingly, the respective LEDs can be mounted in the shortest distance in view of heat radiation properties or working properties. By this, the light-emitting device 1 can be miniaturized. Besides, a light-emitting pattern without uneven brightness can be realized, and the control of a luminous intensity distribution characteristic becomes easy.

Incidentally, chip capacitors 31 and 33 are mounted on both sides of the outer peripheral frame 17 in the X direction. The chip capacitor 31 removes power supply noise between the wiring 21 and the wiring 23, and the chip capacitor 33 removes power supply noise between the wiring 27 and the wiring 29.

Figure 2:
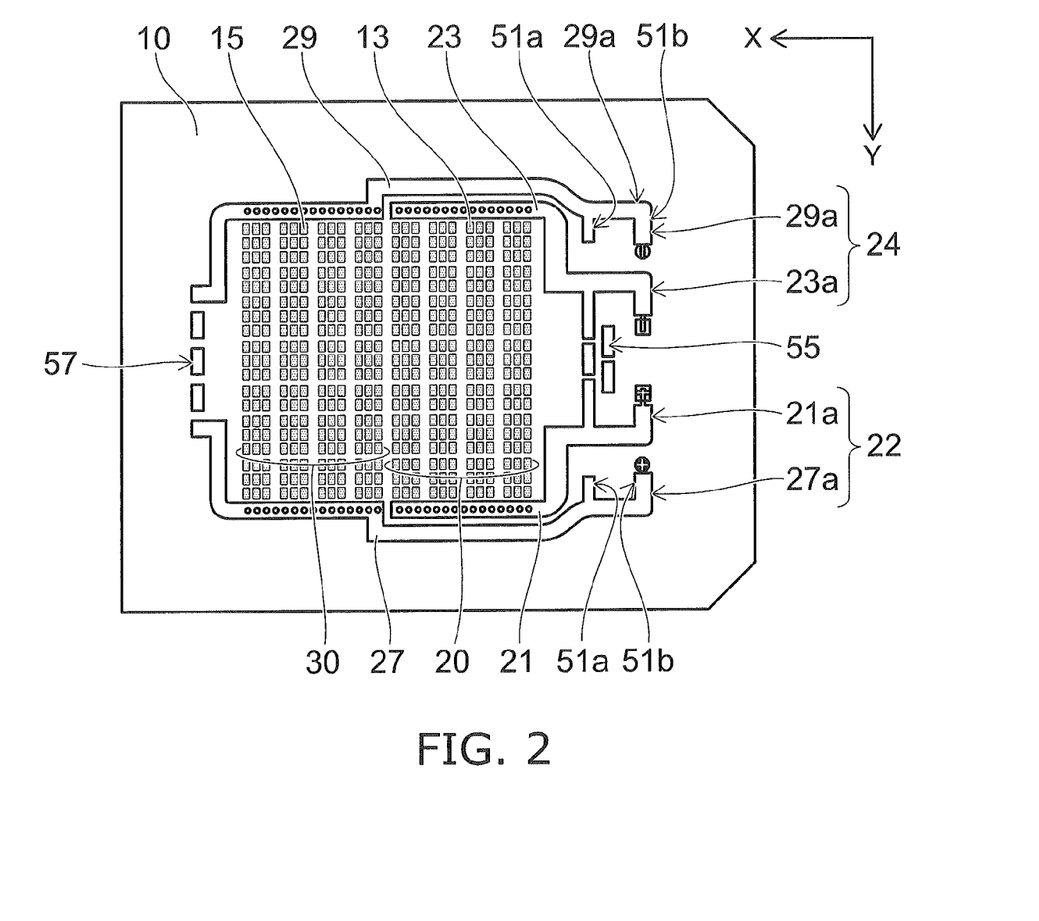
FIG. 2 is a plan view schematically showing the wiring of the light-emitting device.

FIG. 2 is a plan view schematically showing the wiring of the light-emitting device 1 of the first embodiment, and shows a state in which the outer peripheral frame 17, the chip capacitors 31 and 33 and the receptacles 43 are removed from the layout shown in FIG. 1A.

The wiring 21 electrically connects the LED group 20 to the terminal 21a. The anode of the LED 13 is connected to the wiring 21, and the terminal 21a and the anode of the LED 13 are electrically connected.

The wiring 23 electrically connects the LED group 20 to the terminal 23a. The cathode of the LED 13 is connected to the wiring 23, and the terminal 23a and the cathode of the LED 13 are electrically connected.

The wiring 27 electrically connects the LED group 30 to the terminal 27a. The anode of the LED 15 is connected to the wiring 27, and the terminal 27a and the anode of the LED 15 are electrically connected.

The wiring 29 electrically connects the LED group 30 to the terminal 29a. The cathode of the LED 15 is connected to the wiring 29, and the terminal 29a and the cathode of the LED 15 are electrically connected.

By this, the LED group 20 and the LED group 30 mounted inside the outer peripheral frame 17 can be respectively operated by using different lighting circuits. That is, the number of LEDs mounted in the light-emitting area and the light quantity thereof can be increased without using a lighting circuit which drives all LEDs and has a large current capacity.

Besides, in a second direction (Y direction) perpendicular to the first direction, the wiring 21 and the wiring 27 are arranged to be adjacent to each other at one end of the area where the LED group 20 is mounted. The wiring 23 and the wiring 29 are arranged to be adjacent to each other at the other end of the area where the LED group 20 is mounted. Further, the wiring 21 is provided between the wiring 27 and the LED group 20, and the wiring 23 is provided between the wiring 29 and the LED group 20.

By this, the length of the metal wire 35 to connect the LED group 20 to the wiring 21 can be made equal to the length of the metal wire 35 to connect the LED group 30 to the wiring 27. Besides, the length of the metal wire 35 to connect the LED group 20 to the wiring 23 can also be made equal to the length of the metal wire 35 to connect the LED group 30 to the wiring 29. By this, bonding of the metal wire 35 is made easy, and the working efficiency can be improved. Besides, looping of the metal wires 35 can be adjusted into the optimum state. By this, the risk of wire breaking due to a heat cycle generated by on and off of a drive current can be reduced.

A terminal group 22 (first terminal group) including the terminal 21a and the terminal 27a and a terminal group 24 (second terminal group) including the terminal 23a and the terminal 29a are provided side by side in the Y direction on the substrate 10. That is, the wirings 21 and 27 connected to the anodes of the LEDs 13 and 15 and the wirings 23 and 29 connected to the cathodes are respectively collectively arranged on both sides of the mount area of the LED group 20. Since a potential difference between the wiring 21 and the wiring 27 and a potential difference between the wiring 23 and the wiring 29 are small, metal migration in the vicinity of each of them can be suppressed. By this, the reliability of the light-emitting device 1 can be improved.

Figure 3:
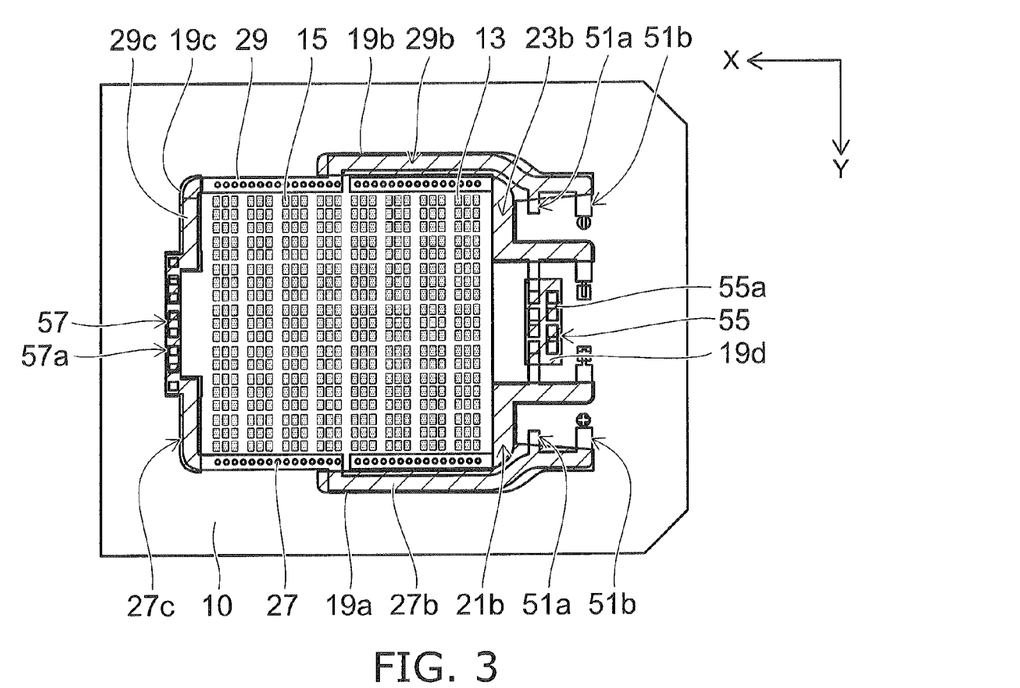
FIG. 3 is another plan view schematically showing the wiring of the light-emitting device.

FIG. 3 is another plan view schematically showing the wiring of the light-emitting device 1 of the first embodiment. This drawing shows a state where the glass coat 19 covering the wirings 21, 23, 27 and 29 is provided. As shown in the drawing, the glass coat 19 is divided into plural portions 19a to 19d on the substrate 10.

The glass coat 19a covers a portion 21b where the outer peripheral frame 17 overlaps the wiring 21 and a portion 27b where the outer peripheral frame overlaps the wiring 27. Further, the glass coat covers also the terminals 21a and 27a except for contact parts 51a and 51b where the receptacles 43 are mounted.

The glass coat 19b covers a portion 23b where the outer peripheral frame 17 overlaps the wiring 23 and a portion 29b where the outer peripheral frame overlaps the wiring 29. Further, the glass coat covers also the terminals 23a and 29a except for contact parts 51a and 51b where the receptacles 43 are mounted.

The glass coat 19c covers a portion 27c where the outer peripheral frame 17 covers the wiring 27 and a portion 29c where the outer peripheral frame covers the wiring 29. Further, the glass coat covers a wiring 57 except for a contact part 57a of the chip capacitor 33.

The glass coat 19d covers a wiring 55 except for a contact part 55a of the chip capacitor 31.

As stated above, the glass coat 19 covers the respective wirings except for the portions where the metal wires 35 are bonded. By this, the surfaces of the respective wirings are protected, and for example, rust or corrosion is suppressed. Besides, in the portions in contact with the outer peripheral frame 17, the adhesion force of the outer peripheral frame 17 is improved.

Figure 4:
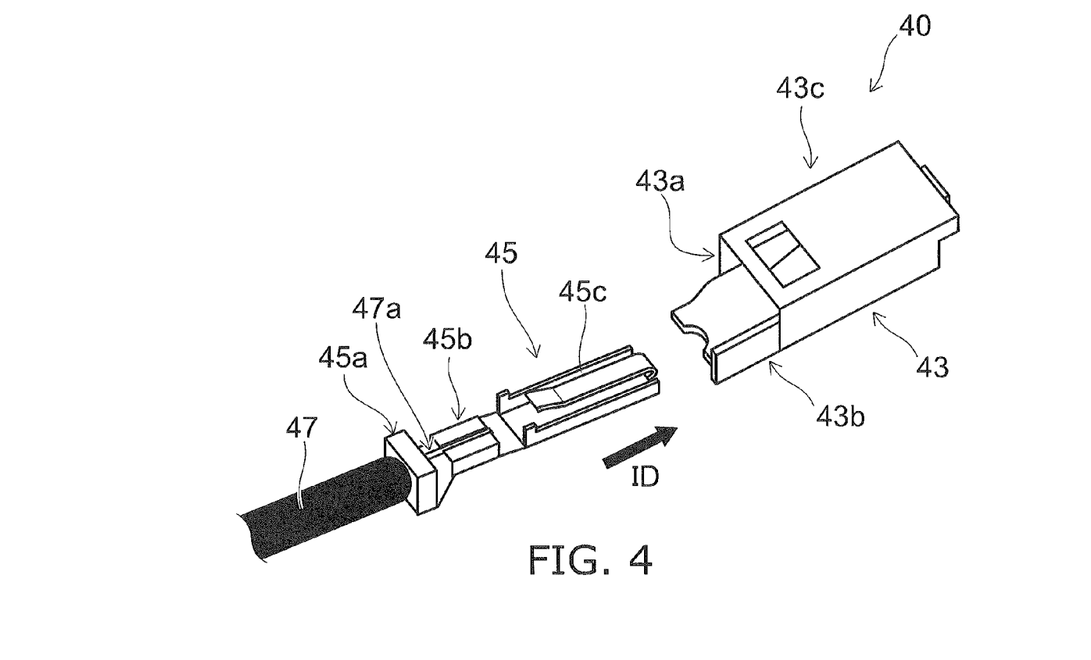
FIG. 4 is a perspective view schematically showing a single pole connector of the light-emitting device.

FIG. 4 is a perspective view schematically showing the single pole connector 40 in the first embodiment. The single pole connector 40 includes the receptacle 43 and a plug 45 which is inserted in the receptacle 43. FIG. 4 shows a state where the receptacle 43 is separated from the plug 45.

The receptacle 43 includes a base part 43b and a cover part 43c. The base part 43b is made of metal, and is bonded to each of the terminals 21a, 23a, 27a and 29a. The cover part 43c includes an insertion port 43a and a gap is formed between itself and the base part 43b.

The plug 45 includes an insertion part 45c, a core wire fixing part 45b, and a caulking part 45a. The caulking part 45a fixes the plug 45 to an end of a lead wire 47 through a coating thereof. A core wire 47a of the lead wire 47 is fixed to the core wire fixing part 45b by, for example, soldering, and electrically connect the lead wire 47 and the plug 45.

The plug 45 is inserted in the receptacle 43 through the insertion port 43a. The plug 45 and the receptacle 43 are detachably fitted to each other, and connect the lead wire 47 to the light-emitting device 1.

In the layout shown in FIG. 1, insertion directions ID of the respective receptacles 43 mounted on the terminals 21a, 23a, 27a and 29a are all parallel to the X direction. By this, coupling between the light-emitting device 1 and the lead wire 47 becomes easy, and working efficiency is improved in the assembling process.

Further, the width in the Y direction of an area where the respective terminals are provided is narrower than a wider one of the width in the Y direction of an area where the LED group 20 is mounted and the width in the Y direction of an area where the LED group 30 is mounted. Thereby, the shift range of the lead wire 47 is narrowed in the Y direction, in the state where the receptacle 43 and the plug 45 are fitted to each other. Hence, the luminaire in which the light-emitting device 1 is mounted can be miniaturized.

Second Embodiment

Figure 5A:
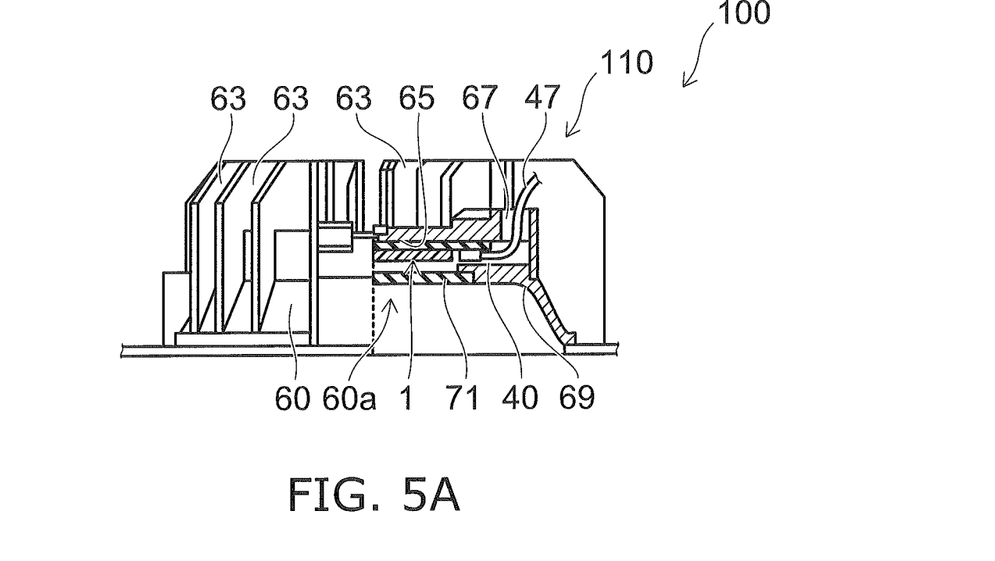
FIGS. 5A and 5B are schematic views showing a light-emitting unit of a luminaire.
Figure 5B:
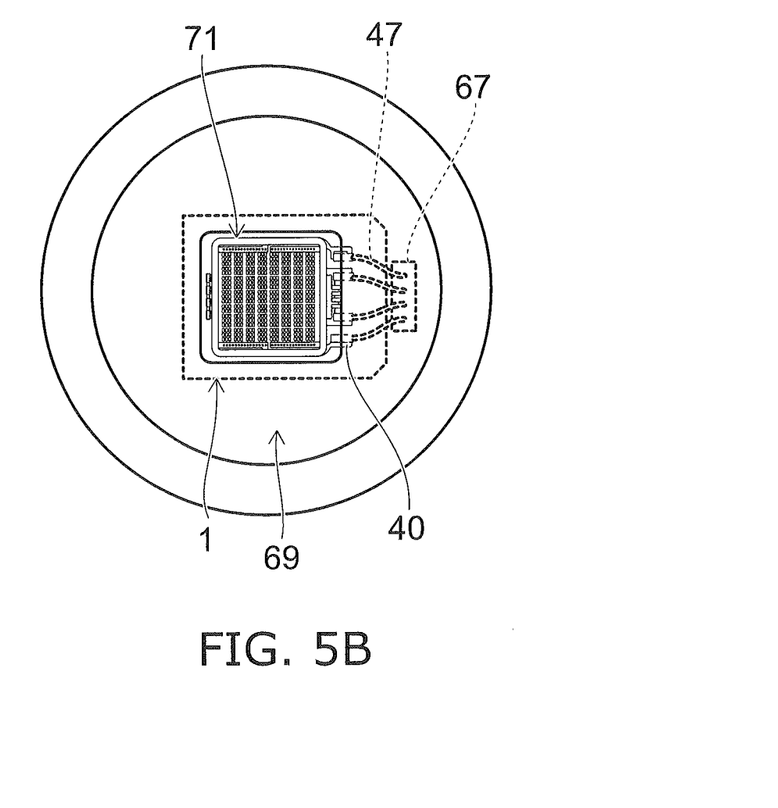
Figure 6:
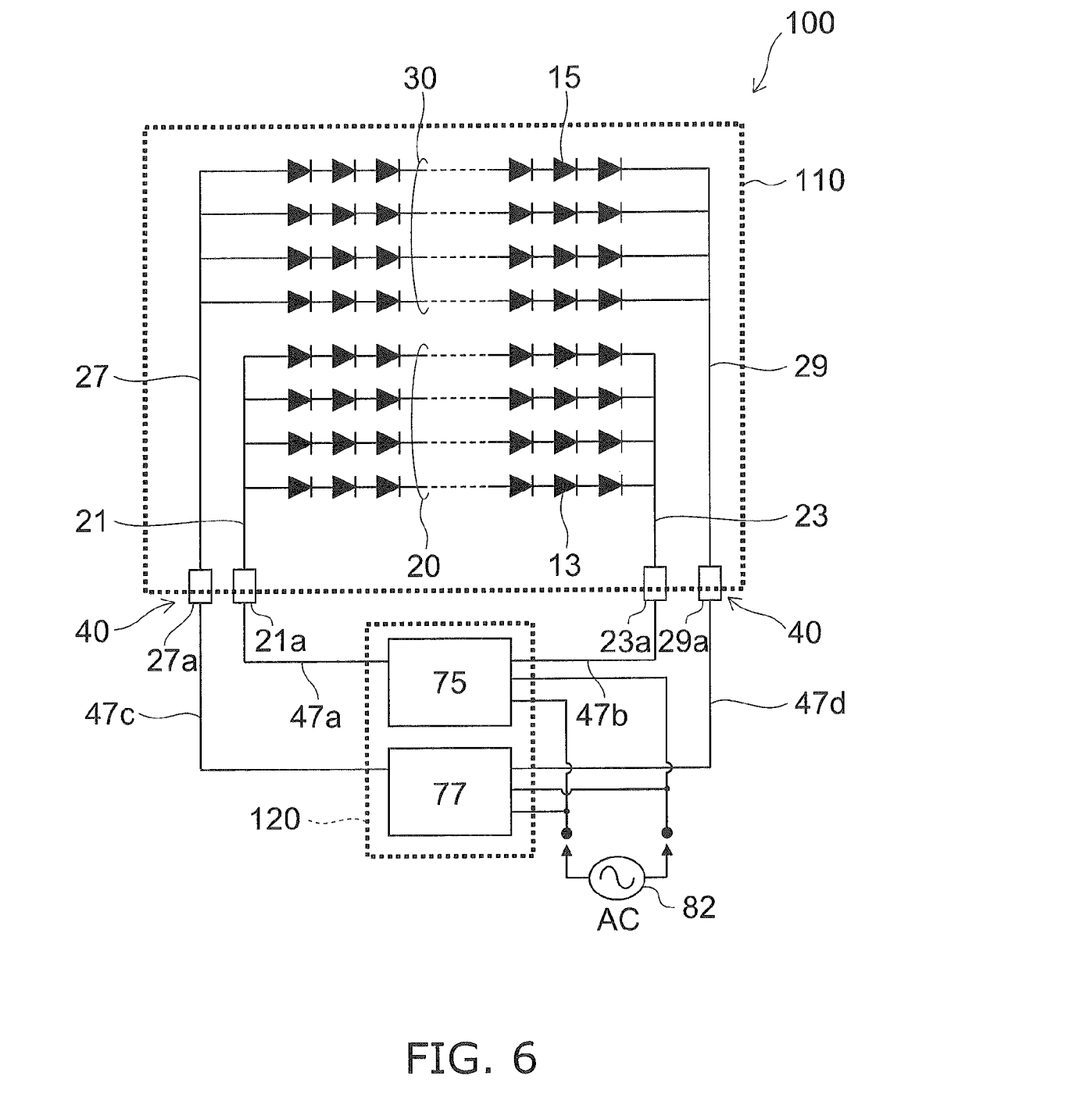
FIG. 6 is a block diagram showing a structure of the luminaire.

FIGS. 5A and 5B are schematic views showing a light-emitting unit 110 of a luminaire 100 of a second embodiment. FIG. 5A is a schematic view showing a side surface and a partial section of the light-emitting unit 110, and FIG. 5B is a lower surface view. FIG. 6 is a block diagram showing a structure of the luminaire 100 of the second embodiment.

The luminaire 100 is a so-called downlight, and includes the light-emitting unit 110 including a light-emitting device 1, and a lighting unit 120. In this embodiment, the light-emitting unit 110 and the lighting unit 120 are placed separately from each other.

As shown in FIG. 5A, the light-emitting unit 110 includes a housing 60 and plural heat radiation plates 63. The housing 60 includes an opening 60a extending downward. The light-emitting device 1 is mounted on a bottom 65 of the opening 60a, and a light-emitting surface 10a thereof is directed downward. The housing 60 is, for example, a die-casted aluminum housing, and efficiently dissipates the heat of the light-emitting device 1 from the bottom 65 of the opening 60a through the heat radiation plates 63.

A reflecting mirror 69 is provided on the side surface of the opening 60a. A translucent cover 71 connected to the reflecting mirror 69 is arranged below the light-emitting device 1. That is, the light-emitting device 1 is contained in a space between the bottom 65 of the opening 60a and the translucent cover 71.

Plural lead wires 47 are connected to the light-emitting device 1 through single pole connectors 40. The lead wires 47 extracted to the outside through an opening 67 provided in the housing 60 are connected to the lighting unit 120 (not-shown in FIG. 5).

As shown in FIG. 6, the luminaire 100 includes the light-emitting unit 110 including an LED group 20 and an LED group 30, and the lighting unit 120 to supply electric power to the LED group 20 and the LED group 30. The lighting unit 120 includes a first lighting circuit (hereinafter called a lighting circuit 75) connected to the light-emitting unit 110 through the plural lead wires 47 and a second lighting circuit (hereinafter called a lighting circuit 77).

A receptacle 43 of the single pole connector 40 is mounted on each of plural terminals 21a, 23a, 27a and 29a. A plug 45 to be fitted to the receptacle 43 is connected to an end of each of the plural lead wires 47a to 47d. The receptacles 43 are fitted to the plugs 45, so that a wiring 21 and the lead wire 47a, a wiring 23 and the lead wire 47b, a wiring 27 and the lead wire 47c, and a wiring 29 and the lead wire 47d are connected through the single pole connectors 40.

That is, the lighting circuit 75 drives the LED group 20 through the terminal 21a connected to anodes of LEDs 13 and the terminal 23a connected to cathodes of the LEDs 13. Besides, the lighting circuit 77 drives the LED group 30 through the terminal 27a connected to anodes of LEDs 15 and the terminal 29a connected to cathodes of the LEDs 15.

On the other hand, the lighting circuits 75 and 77 are connected to, for example, a commercial power supply 82 through a consent plug. Besides, each of the lighting circuits 75 and 77 has only to have a capacity capable of supplying current to half of the plural LEDs mounted on a substrate 10, and the capacity may be half of that of the case where one lighting circuit supplies electric power. That is, the lighting circuit with low cost and high reliability can be used. Besides, in this embodiment, although the example in which the two LED groups are mounted on the substrate 10 is described, no limitation is made to this. That is, a mode is possible in which three or more LED groups are mounted, and a lighting circuit is connected to each of them.

According to the first and the second embodiments, the number of LEDs mounted in the light-emitting area of the substrate 10 is increased, and the light quantity thereof can be increased. The LEDs mounted on the substrate 10 is divided into two groups, and wirings connected to each of them are provided. Each of the two LED groups can be driven by the lighting circuit having a small current capacity. Accordingly, the light source with a large light quantity can be driven by the lighting circuit having a small current capacity, and improvement in reliability and reduction in cost can be realized.

Besides, since the LED chips are connected in series to each other by using the metal wires, a bonding pad is not required to be provided on the substrate. Thus, the LED chips can be closely mounted. By this, the size of the light-emitting area is reduced and the light-emitting device 1 can be miniaturized, and further, uneven light emission can be eliminated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light-emitting device comprising:
   a substrate;
   a first light-emitting element group including a plurality of first light-emitting elements mounted on the substrate;
   a second light-emitting element group that is mounted on the substrate alongside the first light-emitting element group and includes a plurality of second light-emitting elements; and
   a terminal group that includes a plurality of terminals electrically connected to the first light-emitting element group and the second light-emitting element group, and is arranged on a side of the first light-emitting element group opposite to a side thereof facing the second light-emitting element group in a first direction in which the first light-emitting element group and the second light-emitting element group on the substrate are arranged side by side,
   wherein the terminal group includes a first terminal electrically connected to an anode of the first light-emitting element group, a second terminal electrically connected to a cathode of the first light-emitting element group, a third terminal electrically connected to an anode of the second light-emitting element group, and a fourth terminal electrically connected to a cathode of the second light-emitting element group,
   wherein a first terminal group including the first terminal and the third terminal, and a second terminal group including the second terminal and the fourth terminal are mounted side by side on the substrate in a second direction perpendicular to the first direction.

2. The device according to claim 1, further comprising:
   a first wiring to electrically connect the first light-emitting element group to the first terminal;
   a second wiring to electrically connect the first light-emitting element group to the second terminal;
   a third wiring to electrically connect the second light-emitting element group to the third terminal; and
   a fourth wiring to electrically connect the second light-emitting element group to the fourth terminal;
   wherein the first wiring is provided between the third wiring and the first light-emitting element group, and
   the second wiring is provided between the fourth wiring and the first light-emitting element group.

3. The device according to claim 2, wherein
   the first wiring and the third wiring are arranged to be adjacent to each other at one end, in the second direction, of an area where the first light-emitting element group is mounted, and
   the second wiring and the fourth wiring are arranged to be adjacent to each other at the other end, in the second direction, of the area where the first light-emitting element group is mounted.

4. The device according to claim 2, further comprising an outer peripheral frame that is provided on the substrate and surrounds the first light-emitting element group and the second light-emitting element group, wherein each of the first wiring, the second wiring, the third wiring and the fourth wiring includes a glass coat in a portion where the outer peripheral frame overlaps each of the first wiring, the second wiring, the third wiring and the fourth wiring.

5. The device according to claim 4, further comprising a resin layer that is provided inside the outer peripheral frame and covers the first light-emitting element group and the second light-emitting element group.

6. The device according to claim 5, wherein the resin layer includes a phosphor that is excited by a light emitted from the first light-emitting element group and a light emitted from the second light-emitting element group and emits a light having a wavelength different from wavelengths of the lights.

7. The device according to claim 2, wherein
   the first light-emitting element group includes the plurality of first light-emitting elements connected in series to each other through a metal wire,
   the anode of the first light-emitting element positioned at one end of the series connection is electrically connected to the first wiring through a metal wire,
   the cathode of the first light-emitting element positioned at the other end is electrically connected to the second wiring through a metal wire,
   the second light-emitting element group includes the plurality of second light-emitting elements connected in series to each other through a metal wire,
   the anode of the second light-emitting element positioned at one end of the series connection is electrically connected to the third wiring through a metal wire, and
   the cathode of the second light-emitting element positioned at the other end is electrically connected to the fourth wiring through a metal wire.

8. The device according to claim 1, wherein a width, in a second direction perpendicular to the first direction, of an area of the substrate where the terminal group is provided is narrower than a wider one of a width, in the second direction, of an area where the first light-emitting element group is mounted and a width, in the second direction, of an area where the second light-emitting element group is mounted.

9. The device according to claim 1, wherein a receptacle of a single pole connector is mounted on each of the plurality of terminals.

10. The device according to claim 1, wherein
    the substrate is a ceramic substrate, and
    the first light-emitting elements and the second light-emitting elements are mounted on the substrate through an adhesive.

11. A luminaire comprising:
    a light-emitting unit that includes
    a substrate,
    a first light-emitting element group including a plurality of first light-emitting elements mounted on the substrate, a second light-emitting element group that is mounted on the substrate alongside the first light-emitting element group and includes a plurality of second light-emitting elements, and a terminal group that includes a plurality of terminals electrically connected to the first light-emitting element group and the second light-emitting element group, and is arranged on a side of the first light-emitting element group opposite to a side thereof facing the second light-emitting element group in a first direction in which the first light-emitting element group and the second light-emitting element group on the substrate are arranged side by side; and a lighting unit that includes a first lighting circuit to drive the first light-emitting element group through a first terminal connected to an anode of the first light-emitting element and a second terminal connected to a cathode of the first light-emitting element among the plurality of terminals, and a second lighting circuit to drive the second light-emitting element group through a third terminal connected to an anode of the second light-emitting element and a fourth terminal connected to a cathode of the second light-emitting element among the plurality of terminals.

12. The luminaire according to claim 11, further comprising a plurality of lead wires that electrically connect the light-emitting unit to the lighting unit, wherein a receptacle of a single pole connector is mounted on each of the plurality of terminals of the light-emitting unit, a plug fitted to the receptacle is connected to an end of each of the plurality of lead wires connected to the light-emitting unit, and the plug of each of the plurality of lead wires is fitted to the receptacle of each of the plurality of terminals; the first lighting circuit is electrically connected to the first light-emitting element group; and the second lighting circuit is electrically connected to the second light-emitting element group.

13. The luminaire according to claim 12, wherein an insertion direction of the plug into the receptacle is parallel to the first direction.

14. A method of assembling a light-emitting device, comprising:

mounting a first light-emitting element group including a plurality of first light-emitting elements on a substrate and electrically connecting the first light-emitting elements between first and second terminals; and mounting a second light-emitting element group including a plurality of second light-emitting elements on the substrate alongside the first light-emitting element group and electrically connecting the second light-emitting elements between third and fourth terminals, wherein each of the first, second, third, and fourth terminals is arranged alongside the first light-emitting element group opposite to where the second light-emitting element group is alongside the first light-emitting element group, wherein the first light-emitting elements arranged on the substrate form a first rectangular grid;

the second light-emitting elements arranged on the substrate form a second rectangular grid that is alongside the first rectangular grid; and the first, second, third, and fourth terminals are each arranged on a first side of the first rectangular grid that is opposite a second side of the first rectangular grid that is facing the second rectangular grid.

15. The method according to claim 14, wherein the first light-emitting elements are arranged between an anode and a cathode that are at opposite sides of the first rectangular grid and electrically connected to the first and second terminals through first and second wirings, respectively, and the second light-emitting elements are arranged between an anode and a cathode that are at opposite sides of the second rectangular grid and electrically connected to the third and fourth terminals through third and fourth wirings, respectively.

16. The method according to claim 15, wherein the third and fourth wirings extend from opposite sides of the second rectangular grid to the third and fourth terminals after passing through the opposite sides of the first rectangular grid.

17. The method according to claim 16, further comprising:
covering portions of the first, second, third, and fourth wirings with an outer peripheral frame that comprises resin.

18. The method according to claim 17, further comprising:
applying a glass coating on the portions of the first, second, third, and fourth wirings prior to said covering.

* * * * *